United States Patent
Huang et al.

(10) Patent No.: US 10,043,737 B2
(45) Date of Patent: Aug. 7, 2018

(54) CHIP ON FILM PACKAGE

(71) Applicant: Novatek Microelectronics Corp., Hsinchu (TW)

(72) Inventors: Wen-Ching Huang, Hsinchu (TW); Tai-Hung Lin, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 15/336,821

(22) Filed: Oct. 28, 2016

(65) Prior Publication Data

US 2017/0162487 A1 Jun. 8, 2017

Related U.S. Application Data

(60) Provisional application No. 62/261,873, filed on Dec. 2, 2015.

(51) Int. Cl.
*H01L 23/29* (2006.01)
*H01L 23/495* (2006.01)
(Continued)

(52) U.S. Cl.
CPC ........ *H01L 23/49572* (2013.01); *H01L 21/56* (2013.01); *H01L 23/3164* (2013.01); *H01L 23/36* (2013.01); *H01L 23/49568* (2013.01); H01L 21/4882 (2013.01); H01L 23/3121 (2013.01); H01L 23/4985 (2013.01); H01L 24/16 (2013.01); H01L 24/32 (2013.01); H01L 24/73 (2013.01); H01L 24/92 (2013.01); H01L 2224/16227 (2013.01); H01L 2224/32225 (2013.01); H01L 2224/73204 (2013.01);
(Continued)

(58) Field of Classification Search
CPC ... H01L 21/563; H01L 21/56; H01L 23/4951; H01L 23/49562; H01L 23/49572
USPC ........................................................ 257/788
See application file for complete search history.

(56) References Cited

U.S. PATENT DOCUMENTS 6,507,115 B1 * 1/2003 Hofstee ............... H01L 23/3677
257/685
6,849,940 B1 * 2/2005 Chan ....................... H01L 23/16
257/675
(Continued)

FOREIGN PATENT DOCUMENTS

TW I441298 6/2014

OTHER PUBLICATIONS

"Office Action of Taiwan Counterpart Application," dated Sep. 22, 2017, p. 1-p. 4.

*Primary Examiner* — Theresa T Doan
(74) *Attorney, Agent, or Firm* — Jcipmet

(57) ABSTRACT

A chip on film package includes a base film, a chip and a heat-dissipation sheet. The base film includes a first surface. The chip is disposed on the first surface and having a chip length along a first axis of the chip. The heat-dissipation sheet includes a covering portion and a first extending portion connected to the covering portion and attached to first surface. The covering portion at least partially covers the chip and having a first length along the first axis. The first extending portion has a second length along the first axis substantially longer than the first length of the covering portion, and the covering portion exposes a side surface of the chip, wherein the side surface connects a top surface and a bottom surface of the chip.

14 Claims, 5 Drawing Sheets

(51) Int. Cl.
   *H01L 21/56*     (2006.01)
   *H01L 23/31*     (2006.01)
   *H01L 23/36*     (2006.01)
   H01L 23/498    (2006.01)
   H01L 21/48     (2006.01)
   H01L 23/00     (2006.01)

(52) U.S. Cl.
   CPC ............... *H01L 2224/73253* (2013.01); *H01L 2224/92125* (2013.01); *H01L 2924/15192* (2013.01)

(56)         References Cited

U.S. PATENT DOCUMENTS

2006/0071325  A1     4/2006  Tanaka
2006/0113663  A1*    6/2006  Yuan ................... H01L 23/4334
                                                        257/718
2011/0316144  A1*   12/2011  Yoo ......................... H01L 23/36
                                                        257/718
2014/0284040  A1     9/2014  Colgan et al.

* cited by examiner

CHIP ON FILM PACKAGE

CROSS-REFERENCE TO RELATED APPLICATION

This application claims the priority benefits of U.S. provisional application Ser. No. 62/261,873, filed on Dec. 2, 2015. The entirety of the above-mentioned patent application is hereby incorporated by reference herein and made a part of this specification.

BACKGROUND OF THE INVENTION

Field of the Invention

The present invention generally relates to a chip package. More particularly, the present invention relates to a chip on film package.

Description of Related Art

In semiconductor production, the manufacturing of integrated circuits (IC) can be divided into three different stages, namely, a wafer fabrication stage, an integrated circuit fabrication stage and an IC packaging stage such as applying a chip-on-film (COF) package.

To increase the dissipation of heat from a chip of a COF package, a heat dissipation sheet is normally attached to a top surface of the base film to cover the whole chip or attached to a bottom surface of the base film opposite to the chip using thermal conductive glue after the chip is electrically connected to the film via bumps. Conventionally, during the process of attaching the heat dissipation sheet on the film for covering the chip, it is hard to make the heat dissipation sheet and the chip tightly attached together, so air gap usually exists between the chip and the heat dissipation sheet. As such, the air trapped between the chip and the heat dissipation sheet would expand during the subsequent thermal process, which may cause the heat dissipation sheet separating from the chip and reduce the reliability of the chip package. Moreover, since the heat conductivity of air is rather low, the air trapped in the space between the chip and the heat dissipation sheet would also affect the efficiency for heat generated from the chip to be conducted to the heat dissipation sheet.

SUMMARY OF THE INVENTION

Accordingly, the present invention is directed to a chip on film package with favourable heat dissipation efficiency.

The present invention provides a chip on film package including a base film, a chip and a heat-dissipation sheet. The base film includes a first surface. The chip is disposed on the first surface and having a chip length along a first axis of the chip. The heat-dissipation sheet includes a covering portion and a first extending portion connected to the covering portion and attached to first surface. The covering portion at least partially covers the chip and having a first length along the first axis. The first extending portion has a second length along the first axis substantially longer than the first length of the covering portion, and the covering portion exposes a side surface of the chip, wherein the side surface connecting a top surface and a bottom surface of the chip.

According to an embodiment of the present invention, the first length is substantially equal to or shorter than the chip length, such that the covering portion exposes the side surface of the chip.

According to an embodiment of the present invention, the first length is substantially longer than the chip length, and the covering portion is cantilevered over the top surface of the chip to expose the side surface of the chip.

According to an embodiment of the present invention, the chip is disposed on a peripheral region of the base film.

According to an embodiment of the present invention, the chip is disposed at a central region of the base film.

According to an embodiment of the present invention, the heat-dissipation sheet further includes a second extending portion, and the covering portion is connected between the first extending portion and the second extending portion.

According to an embodiment of the present invention, the heat-dissipation sheet includes a heat-dissipation layer and a protection layer, the heat-dissipation layer is attached to the base film and the chip, and the protection layer completely covers the heat-dissipation layer.

According to an embodiment of the present invention, the protection layer includes an insulating film.

According to an embodiment of the present invention, the heat-dissipation layer includes a metal foil or a graphite film.

According to an embodiment of the present invention, the heat-dissipation sheet further includes a first adhesive layer, and the heat-dissipation layer is attached to the base film and the chip by the first adhesive layer.

According to an embodiment of the present invention, a size of the protection layer is greater than a size of the heat-dissipation layer, and a protection distance maintains between a contour line of the protection layer and a contour line of the heat-dissipation layer.

According to an embodiment of the present invention, the heat-dissipation sheet further includes a second adhesive layer formed on an attaching surface of the protection layer and adhering to the heat-dissipation layer.

According to an embodiment of the present invention, the protection layer includes a boundary region surrounding a boundary of the attaching surface of the protection layer, and the second adhesive layer exposes the boundary region of the protection layer.

According to an embodiment of the present invention, the chip on film package further includes an auxiliary heat-dissipation sheet disposed on a second surface of the base film opposite to the first surface of the base film.

In light of the foregoing, in the present invention, the chip on film package utilizes the heat-dissipation sheet including a covering portion and at least one extending portion, wherein the covering portion covers the chip and exposes a side surface of the chip, and the extending portion connects the covering portion and is attached to the base film. With such configuration, the air between the chip and the heat-dissipation sheet can be easily discharged since the covering portion of the heat-dissipation sheet does not completely enclose the chip but actually exposes the side surface of the chip. As such, the heat-dissipation sheet would not be deformed or even separated from the chip during subsequent thermal process, so as to improve the reliability of the chip on film package.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
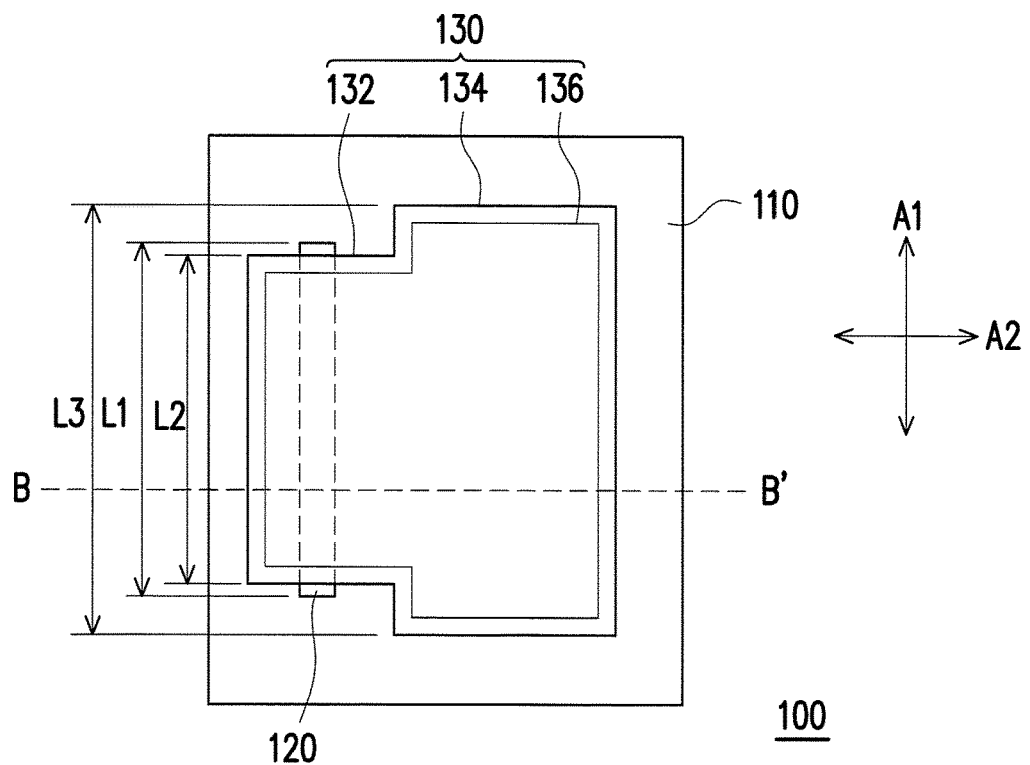
FIG. 1A illustrates a top view of a chip on film package according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
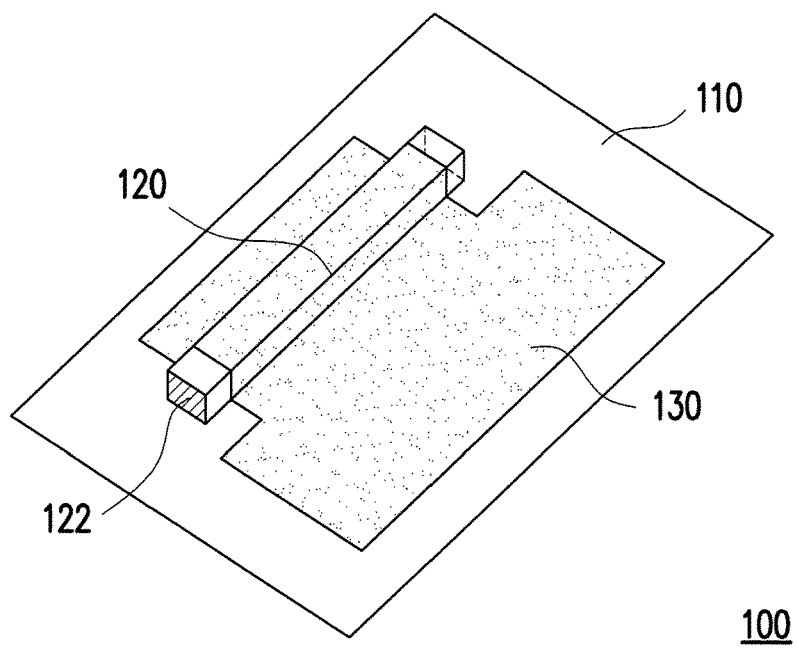
FIG. 1B illustrates a perspective view of the chip on film package of FIG. 1A.
Figure 5:
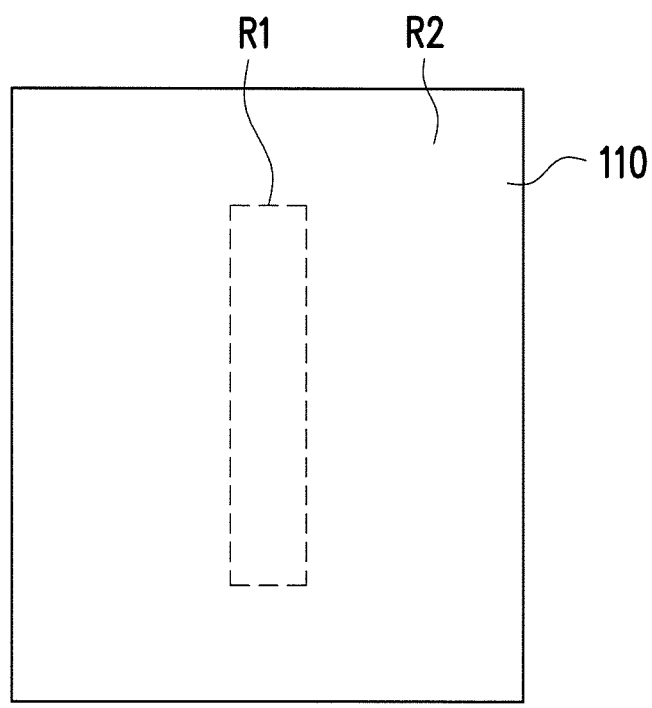
FIG. 5 illustrates a top view of a base film of a chip on film package according to an embodiment of the invention.
Figure 6:
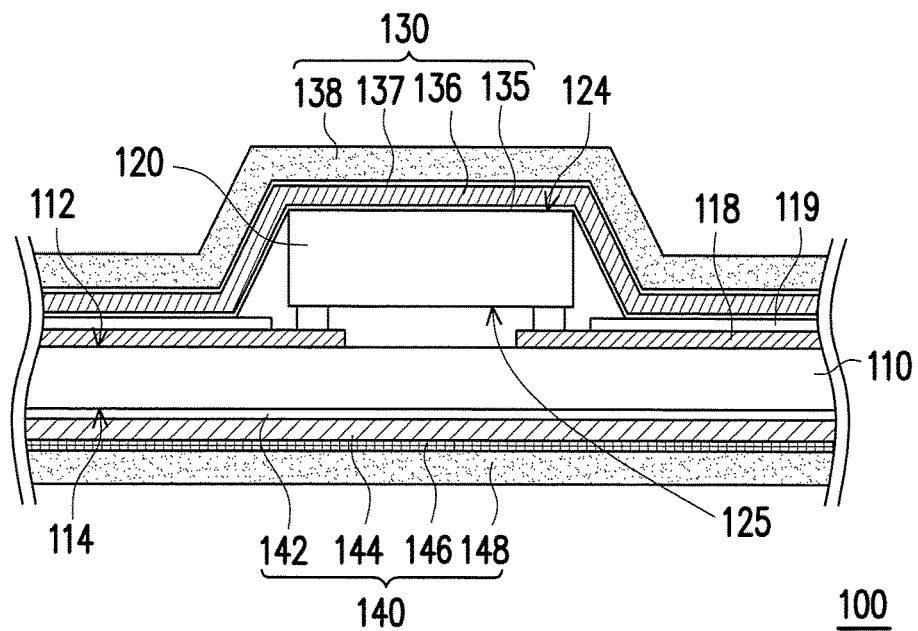
FIG. 6 illustrates a cross sectional view of a chip on film package according to an embodiment of the invention.

FIG. 1A illustrates a top view of a chip on film package according to an embodiment of the invention. FIG. 1B illustrates a perspective view of the chip on film package of FIG. 1A. FIG. 5 illustrates a top view of a base film of a chip on film package according to an embodiment of the invention. FIG. 6 illustrates a cross sectional view of a chip on film package according to an embodiment of the invention, the cross sectional view of the chip on film package 100 in FIG. 1A along a line B-B'. Referring to FIG. 1A, FIG. 1B, FIG. 5 and FIG. 6, in the present embodiment, a chip on film package 100 includes a base film 110, a chip 120 and a heat-dissipation sheet 130. The base film 110 includes a first surface 112 and a second surface 114 opposite to the first surface 112. The chip 120 is disposed on the first surface 112 and has a chip length L1 along a first axis A1 of the chip 120, wherein the first axis A1 may be the longitudinal axis of the chip 120, but the present invention is not limited thereto. In the present embodiment, the base film 110 may further include a patterned circuit layer 118 and a solder resist layer 119. The patterned circuit layer 118 is disposed on the first surface 112 of the base film 110. The solder resist layer 119 covers the patterned circuit layer 118 and exposes a part of the patterned circuit layer 118, such that the chip 120 is electrically connected to the patterned circuit layer 118 exposed by the solder resist layer 119.

The heat-dissipation sheet 130 includes a covering portion 132 and a first extending portion 134 as shown in FIG. 1A. The covering portion 132 at least partially covers the chip 120 and is attached to the base film 110. A filling material such as resin may be filled between the chip 120, the base film 110 and the heat-dissipation sheet 130 to further fix the position of the chip 120. The covering portion 132 has a first length L2 (recited as length L2 hereinafter) along the first axis A1. The first extending portion 134 is connected to the covering portion 132 and attached to first surface 112 of the base film 110. The first extending portion 134 has a second length L3 (recited as length L3 hereinafter) along the first axis A1, and the length L3 of first extending portion 134 is substantially longer than the length L2 of the covering portion 132, and the covering portion 132 exposes a side surface 122 of the chip 120 as shown in FIG. 1B. In the present embodiment, the side surface 122 of the chip connects a top surface 124 and a bottom surface 125 of the chip 120 as shown in FIG. 6.

With such configuration, the air and/or moisture in the space between the chip 120 and the heat-dissipation sheet 130 can be easily discharged since the covering portion 132 of the heat-dissipation sheet 130 does not completely enclose the chip 120 but exposes the side surface 122 of the chip 120. As such, the heat-dissipation sheet 130 would not be deformed or even separated from the chip 120 under high temperature and/or high humidity condition, so as to improve the reliability of the chip on film package.

To be more specific, the length L2 of the covering portion 132 is substantially equal to or shorter than the chip length L1. In the present embodiment, the length L2 of the covering portion 132 is shorter than the chip length L1 as shown in FIG. 1A, such that the covering portion 132 exposes a part of the top surface 124 and the side surface 122 of the chip 120. In other embodiment, the length L2 of the covering portion 132 may be substantially equal to the chip length L1. Namely, an edge of the covering portion 132 is aligned with an edge of the chip 120, such that the covering portion 132 exposes the side surface 122 of the chip 120. The base film 110 includes a central region R1 and a peripheral region R2 surrounding the central region R1 as shown in FIG. 5. In the present embodiment, the chip 120 is disposed on the peripheral region R2 of the base film 110. The heat-dissipation sheet 130 covers the chip 120 with its covering portion 132 and is attached to the base film 110 with its first extending portion 134. It should be noted that the orientation terminology such as the central region R1 and the peripheral region R2 mentioned above are relative terms, and the central region R1 is not necessarily located at the center of the base film 110. The components of the invention can be positioned in a number of different orientations. As such, the orientation terminology is used for purposes of illustration and is in no way limiting.

In detail, the heat-dissipation sheet 130 may further include a first adhesive layer 135, a heat-dissipation layer 136, a second adhesive layer 137 and a protection layer 138 as shown in FIG. 6, wherein the heat-dissipation layer 136 is attached to the base film 110 and the chip 120 by the first adhesive layer 135, the protection layer 138 completely covers the heat-dissipation layer 136, and the second adhesive layer 137 is formed on an attaching surface of the protection layer 138 and adhered to the heat-dissipation layer 136. In the present embodiment, the protection layer 138 may include an insulating film, and the heat-dissipation layer 136 may include a metal foil or a graphite film, but the invention is not limited thereto.

In the present embodiment, a size of the protection layer 138 is greater than a size of the heat-dissipation layer 136, and a protection distance maintains between a contour line of the protection layer 138 and a contour line of the heat-dissipation layer 136 as shown in FIG. 6. Namely, heat-dissipation layer 136 exposes a boundary region of the protection layer 138. Similarly, the size of the protection layer 138 is greater than a size of the second adhesive layer 137, and a protection distance maintains between a contour line of the protection layer 138 and a contour line of the second adhesive layer 137 as shown in FIG. 6. Namely, the protection layer 138 includes a boundary region surrounding a boundary of the attaching surface of the protection layer 138, and the second adhesive layer 137 exposes the boundary region of the protection layer 138. As such, the issue of adhesive overflow when the heat dissipation sheet 130 is pressed to be attached to the base film 110 can be avoided.

In addition, the chip on film package 100 may further include an auxiliary heat-dissipation sheet 140 disposed on a second surface 114 of the base film 110 as shown in FIG. 6. The structure of the auxiliary heat-dissipation sheet 140 may be the same or similar to the structure of the heat-dissipation sheet 130. Namely, the auxiliary heat-dissipation sheet 140 may also include a first adhesive layer 142, a heat-dissipation layer 144, a second adhesive layer 146 and a protection layer 148 as shown in FIG. 6, wherein the heat-dissipation layer 144 is attached to the second surface 114 of the base film 110 by the first adhesive layer 142, the protection layer 148 completely covers the heat-dissipation layer 144, and the second adhesive layer 146 is formed on an attaching surface of the protection layer 148 and adhered to the heat-dissipation layer 144.

Similarly, a size of the protection layer 148 is greater than a size of the heat-dissipation layer 144, so a protection distance maintains between a contour line of the protection layer 148 and a contour line of the heat-dissipation layer 144 as shown in FIG. 6. The size of the protection layer 148 is greater than the size of the second adhesive layer 146, such that the second adhesive layer 146 exposes the boundary region of the protection layer 148. As such, the issue of adhesive overflow when the auxiliary heat dissipation sheet 140 is pressed to be attached to the base film 110 can be avoided.

Figure 2A:
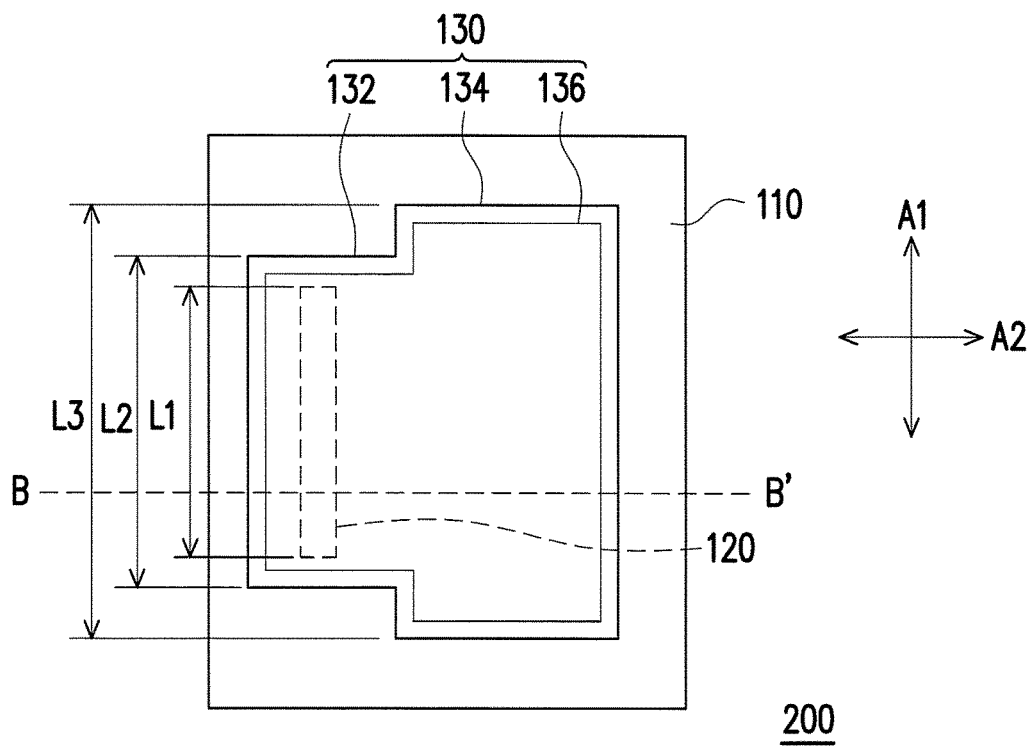
FIG. 2A illustrates a top view of a chip on film package according to another embodiment of the invention.
Figure 2B:
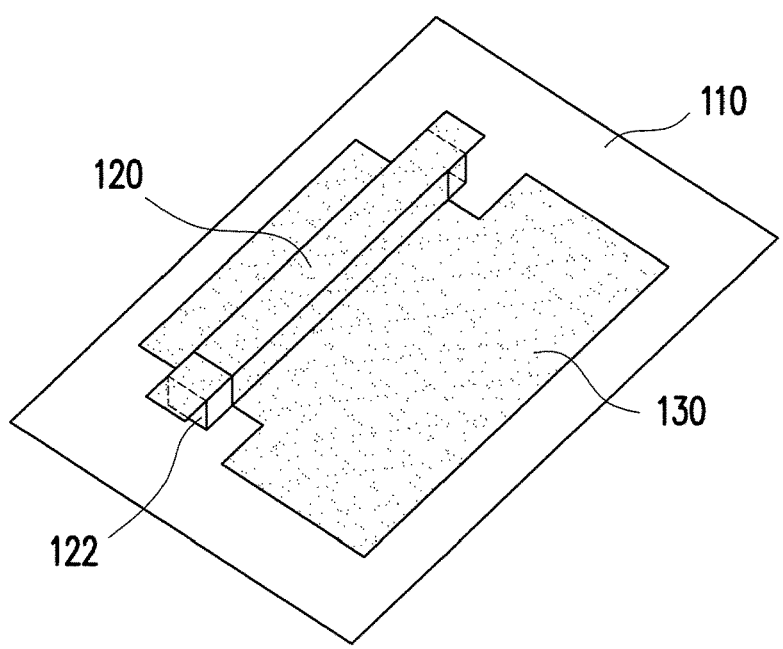
FIG. 2B illustrates a perspective view of the chip on film package of FIG. 2A.

FIG. 2A illustrates a top view of a chip on film package according to another embodiment of the invention. It is noted that a chip on film package 200 shown in FIG. 2A contains many features same as or similar to the chip on film package 100 disclosed earlier with FIG. 1A. FIG. 2B illustrates a perspective view of the chip on film package 200 of FIG. 2A. A cross sectional view of the chip on film package 200 alone a line B-B' is similar to FIG. 6. For purpose of clarity and simplicity, detail description of same or similar features may be omitted, and the same reference numbers denote the same or similar components. The main differences between the chip on film package 200 shown in FIG. 2A and the chip on film package 100 shown in FIG. 1A are described as follows.

In the present embodiment, the length L2 of the covering portion 132 is substantially longer than the chip length L1 as shown in FIG. 2A. As such, the covering portion 132 is cantilevered over the top surface 124 of the chip 120 to expose the side surface 122 of the chip 120 as shown in FIG. 2B. It is shown that the invention does not limit the length L2 of the covering portion 132 along the first axis A1 as long as the covering portion 132 exposes the side surface 122 of the chip 120.

Figure 3:
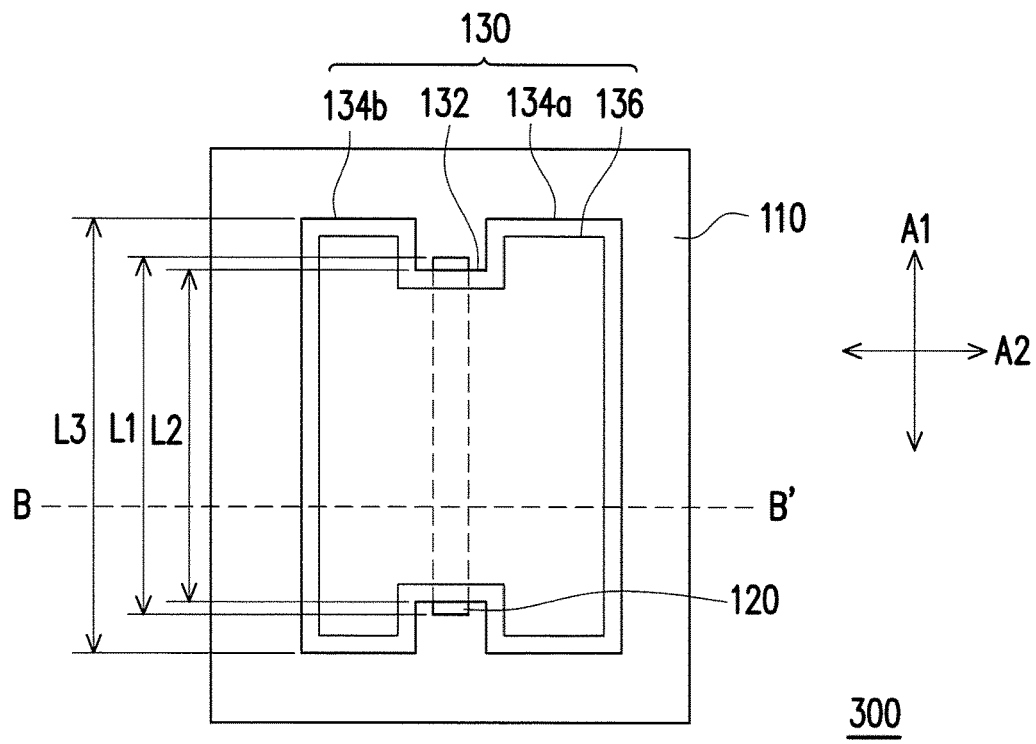
FIG. 3 illustrates a top view of a chip on film package according to yet another embodiment of the invention.

FIG. 3 illustrates a top view of a chip on film package according to yet another embodiment of the invention. It is noted that a chip on film package 300 shown in FIG. 3 contains many features same as or similar to the chip on film package 100 disclosed earlier with FIG. 1A. A cross sectional view of the chip on film package 300 alone a line B-B' is similar to FIG. 6. For purpose of clarity and simplicity, detail description of same or similar features may be omitted, and the same reference numbers denote the same or similar components. The main differences between the chip on film package 300 shown in FIG. 3 and the chip on film package 100 shown in FIG. 1A are described as follows.

In the present embodiment, the chip 120 is disposed on a central region (for example, the central region R1 shown in FIG. 5) of the base film 110. With this configuration, the heat-dissipation sheet 130 may include a first extending portion 134a and a second extending portion 134b, and both of the first extending portion 134a and the second extending portion 134b are attached to the base film 110. The covering portion 132 is connected between the first extending portion 134a and the second extending portion 134b. Namely, the first extending portion 134a and the second extending portion 134b are respectively connected two opposite sides of the covering portion 132 along a second axis A2 perpendicular to the first axis A1.

To be more specific, the length L2 of the covering portion 132 is substantially equal to or shorter than the chip length L1 of the chip 120. In the present embodiment, the length L2 of the covering portion 132 is shorter than the chip length L1 of the chip 120, such that the covering portion 132 exposes a part of the top surface 124 and the side surface 122 of the chip 120. Certainly, in other embodiment, the length L2 of the covering portion 132 may be substantially equal to the chip length L1 of the chip 120, such that the covering portion 132 exposes the side surface 122 of the chip 120. Namely, an edge of the covering portion 132 is aligned with an edge of the chip 120, so the covering portion 132 exposes the side surface 122 of the chip 120.

Figure 4:
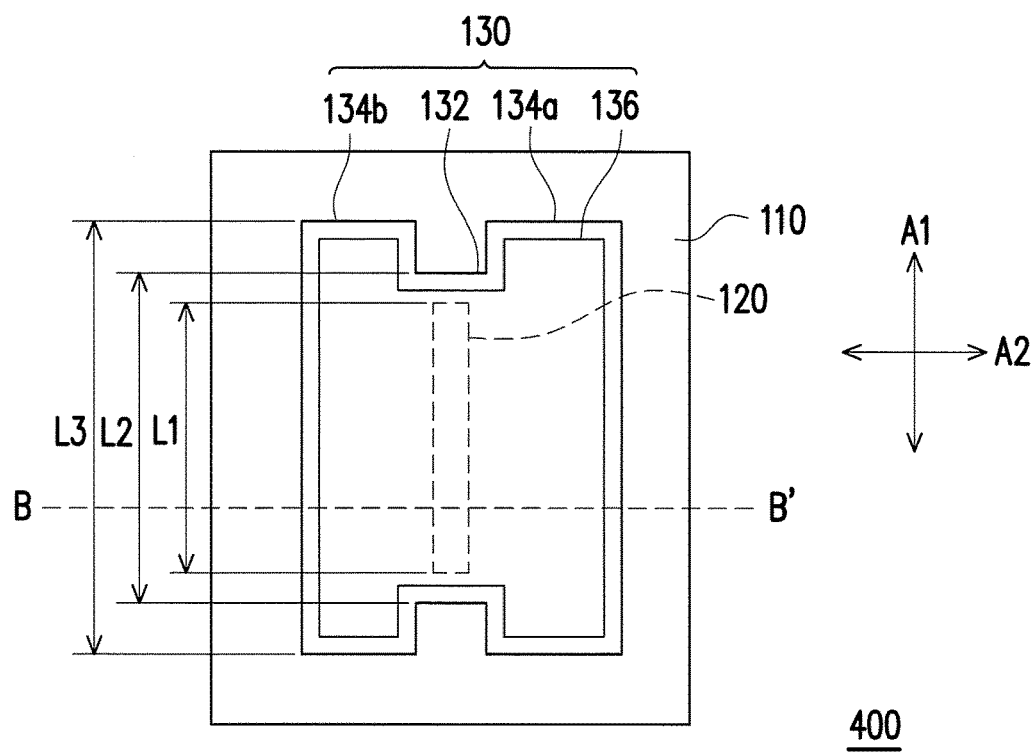
FIG. 4 illustrates a top view of a chip on film package according to yet another embodiment of the invention.

FIG. 4 illustrates a top view of a chip on film package according to yet another embodiment of the invention. It is noted that a chip on film package 400 shown in FIG. 4 contains many features same as or similar to the chip on film package 100 disclosed earlier with FIG. 3. A cross sectional view of the chip on film package 400 alone a line B-B' is similar to FIG. 6. For purpose of clarity and simplicity, detail description of same or similar features may be omitted, and the same reference numbers denote the same or similar components. The main differences between the chip on film package 400 shown in FIG. 4 and the chip on film package 100 shown in FIG. 3 are described as follows.

In the present embodiment, the length L2 of the covering portion 132 is substantially longer than the chip length L1 of the chip 120 as shown in FIG. 4. As such, the covering portion 132 is cantilevered over the top surface 124 of the chip 120 to expose the side surface 122 of the chip 120. It is shown that the invention does not limit the length L2 of the covering portion 132 along the first axis A1 as long as the covering portion 132 exposes the side surface 122 of the chip 120.

Figure 7:
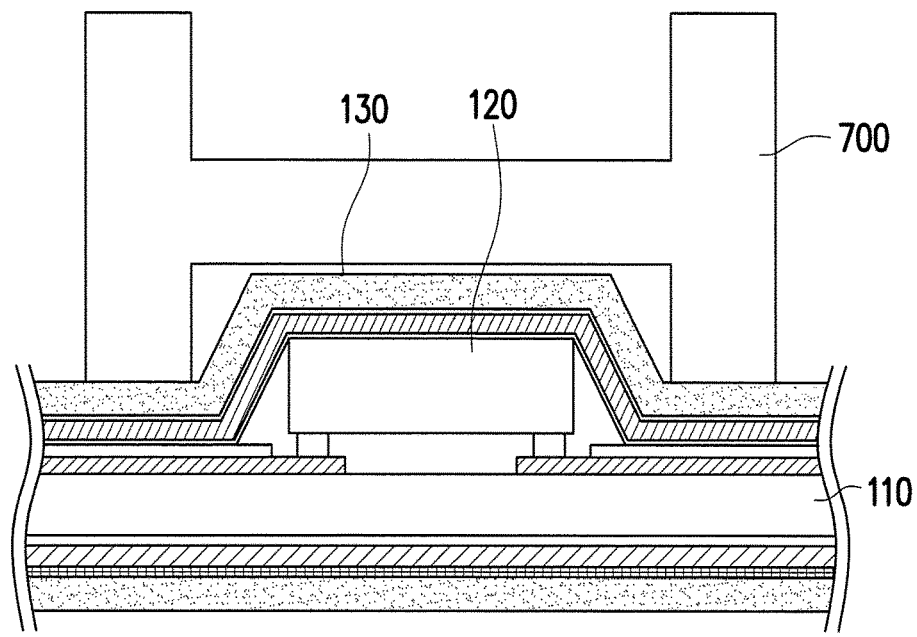
FIG. 7 illustrates an elevation view of a chip on film package and a fixture for attaching a heat-dissipation sheet according to an embodiment of the invention.

FIG. 7 illustrates an elevation view of a chip on film package (e.g., chip on film package 100, 200, 300, or 400) and a fixture for attaching a heat-dissipation sheet according to an embodiment of the invention. Referring to FIG. 7, in the present embodiment, the heat dissipation sheet 130 may be pressed and attached to the base film 110 by a fixture 700. The fixture 700 may be made of flexible material to avoid damaging the chip on film package. In the present embodiment, the fixture 700 includes a cavity corresponding to the location of the chip 120, so the cavity is configured to accommodate the chip 120 when the fixture 700 presses the heat dissipation sheet 130 onto the base film 110. The fixture 700 may move (e.g., roll) from one side of the chip 120 to the other side of the chip 120 along the longitudinal axis to press the heat dissipation sheet 130 to be attached on the base film 110 and cover the chip 120. In the present embodiment, a gap may exist between the cavity of the fixture 700 and the chip 120, and the gap may be in a range from 0.5 mm to 1 mm, but the invention is not limited thereto.

In sum, the chip on film package of the invention utilizes the heat-dissipation sheet including a covering portion and at least one extending portion, wherein the covering portion covers the chip and exposes a side surface of the chip, and the extending portion connects the covering portion and is attached to the base film. With such configuration, the air and/or moisture in the space between the chip and the heat-dissipation sheet can be easily discharged since the covering portion of the heat-dissipation sheet does not completely enclose the chip but actually exposes the side surface of the chip. As such, the heat-dissipation sheet would not be deformed or even separated from the chip under high temperature and/or high humidity condition, so as to improve the reliability of the chip on film package.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip on film package, comprising:
   a base film comprising a first surface;
   a chip disposed on the first surface and having a chip length along a first axis of the chip and a chip width along a second axis of the chip perpendicular to the first axis; and
   a heat-dissipation sheet comprising a covering portion and a first extending portion connected to the covering portion and attached to first surface, the covering portion at least partially covering the chip and having a first length along the first axis and a third length along the second axis being longer than the chip width of the chip, the first extending portion having a second length along the first axis substantially longer than the first length of the covering portion, and the covering portion exposing a side surface of the chip, wherein the side surface connects a top surface and a bottom surface of the chip.

2. The chip on film package as claimed in claim 1, wherein the first length is substantially equal to or shorter than the chip length, such that the covering portion exposes the side surface of the chip.

3. The chip on film package as claimed in claim 1, wherein the first length is substantially longer than the chip length, and the covering portion is cantilevered over the top surface of the chip to expose the side surface of the chip.

4. The chip on film package as claimed in claim 1, wherein the chip is disposed on a peripheral region of the base film.

5. The chip on film package as claimed in claim 1, wherein the chip is disposed at a central region of the base film.

6. The chip on film package as claimed in claim 1, wherein the heat-dissipation sheet further comprises a second extending portion, and the covering portion is connected between the first extending portion and the second extending portion.

7. The chip on film package as claimed in claim 1, wherein the heat-dissipation sheet comprises a heat-dissipation layer and a protection layer, the heat-dissipation layer is attached to the base film and the chip, and the protection layer completely covers the heat-dissipation layer.

8. The chip on film package as claimed in claim 7, wherein the protection layer comprises an insulating film.

9. The chip on film package as claimed in claim 7, wherein the heat-dissipation layer comprises a metal foil or a graphite film.

10. The chip on film package as claimed in claim 7, wherein the heat-dissipation sheet further comprises a first adhesive layer, and the heat-dissipation layer is attached to the base film and the chip by the first adhesive layer.

11. The chip on film package as claimed in claim 7, wherein a size of the protection layer is greater than a size of the heat-dissipation layer, and a protection distance maintains between a contour line of the protection layer and a contour line of the heat-dissipation layer.

12. The chip on film package as claimed in claim 11, wherein the heat-dissipation sheet further comprises a second adhesive layer formed on an attaching surface of the protection layer and adhering to the heat-dissipation layer.

13. The chip on film package as claimed in claim 12, wherein the protection layer comprises a boundary region surrounding a boundary of the attaching surface of the protection layer, and the second adhesive layer exposes the boundary region of the protection layer.

14. The chip on film package as claimed in claim 1, further comprises an auxiliary heat-dissipation sheet disposed on a second surface of the base film opposite to the first surface of the base film.

* * * * *